(12) United States Patent
Jain

(10) Patent No.: US 11,386,942 B2
(45) Date of Patent: Jul. 12, 2022

(54) SYSTEMS AND METHODS FOR CONTROLLING POWER ASSERTION IN A MEMORY DEVICE

(71) Applicant: Taiwan Semiconductor Manufacturing Company, Ltd., Hsinchu (TW)

(72) Inventor: Sanjeev Kumar Jain, Ottawa (CA)

(73) Assignee: Taiwan Semiconductor Manufacturing Company, ltd., Hsinchu (TW)

( * ) Notice: Subject to any disclaimer, the term of this patent is extended or adjusted under 35 U.S.C. 154(b) by 0 days.

(21) Appl. No.: 17/179,682

(22) Filed: Feb. 19, 2021

(65) Prior Publication Data

US 2022/0068330 A1   Mar. 3, 2022

Related U.S. Application Data

(60) Provisional application No. 63/070,864, filed on Aug. 27, 2020.

(51) Int. Cl.
*G11C 8/00* (2006.01)
*G11C 7/22* (2006.01)
*G11C 7/20* (2006.01)
*G11C 8/08* (2006.01)
*G11C 8/10* (2006.01)
*G11C 7/10* (2006.01)

(52) U.S. Cl.
CPC ............. *G11C 7/222* (2013.01); *G11C 7/1039* (2013.01); *G11C 7/20* (2013.01); *G11C 8/08* (2013.01); *G11C 8/10* (2013.01); *G11C 2207/2227* (2013.01)

(58) Field of Classification Search
CPC ...................................... G11C 7/222
See application file for complete search history.

(56) References Cited

U.S. PATENT DOCUMENTS 9,922,702 B1 *   3/2018   Shanmugam ......... G11C 11/412

* cited by examiner

*Primary Examiner* — Hoai V Ho
(74) *Attorney, Agent, or Firm* — Jones Day

(57) ABSTRACT

Systems and methods are provided for controlling a sleep operation for a memory array. A memory system may include a memory array with a memory cell and a word line driver, the memory array receiving a word line clock signal that enables and disables memory read and write operations of the memory cell. The memory array may further including a switching circuit coupled between the word line driver and a power source, the switching circuit being controlled by a local word line sleep signal to turn power to the word line driver on and off. A latch circuit may generate the local word line sleep signal in response to a delayed clock signal and one or more power management control signals. The word line clock signal and the delayed clock signal may both being generated as a function of a memory clock signal. The latch circuit may synchronize the local word line sleep signal with the delayed clock signal such that the local word line sleep signal is prevented from turning off power to the word line driver until memory read and write operations of the memory cell are disabled by the word line clock signal.

20 Claims, 12 Drawing Sheets

SYSTEMS AND METHODS FOR CONTROLLING POWER ASSERTION IN A MEMORY DEVICE

CROSS-REFERENCE TO RELATED APPLICATIONS

This application claims priority to U.S. Provisional Application No. 63/070,864, filed Aug. 27, 2020, entitled "Memory Power Assertion Circuit" which is incorporated herein by reference in its entirety.

TECHNICAL FIELD

The technology described in this patent document relates generally to semiconductor memory systems, and more particularly to power management systems and methods for a semiconductor memory system.

BACKGROUND

Power management (PM) signals for controlling power in a semiconductor memory circuit are typically asynchronous. However, power management signals typically need to be asserted in the same cycle without impacting the current operation of the memory device (e.g., R/W, DFT or pipeline.) Power management assertion is therefore synchronous. Synchronous power management assertion may, however, make it difficult to achieve certain design margins, such as ensuring that the word line is not turned off as a result of power management assertion in a given cycle.

BRIEF DESCRIPTION OF THE DRAWINGS

Aspects of the present disclosure are best understood from the following detailed description when read with the accompanying figures.

DETAILED DESCRIPTION

Figure 1:
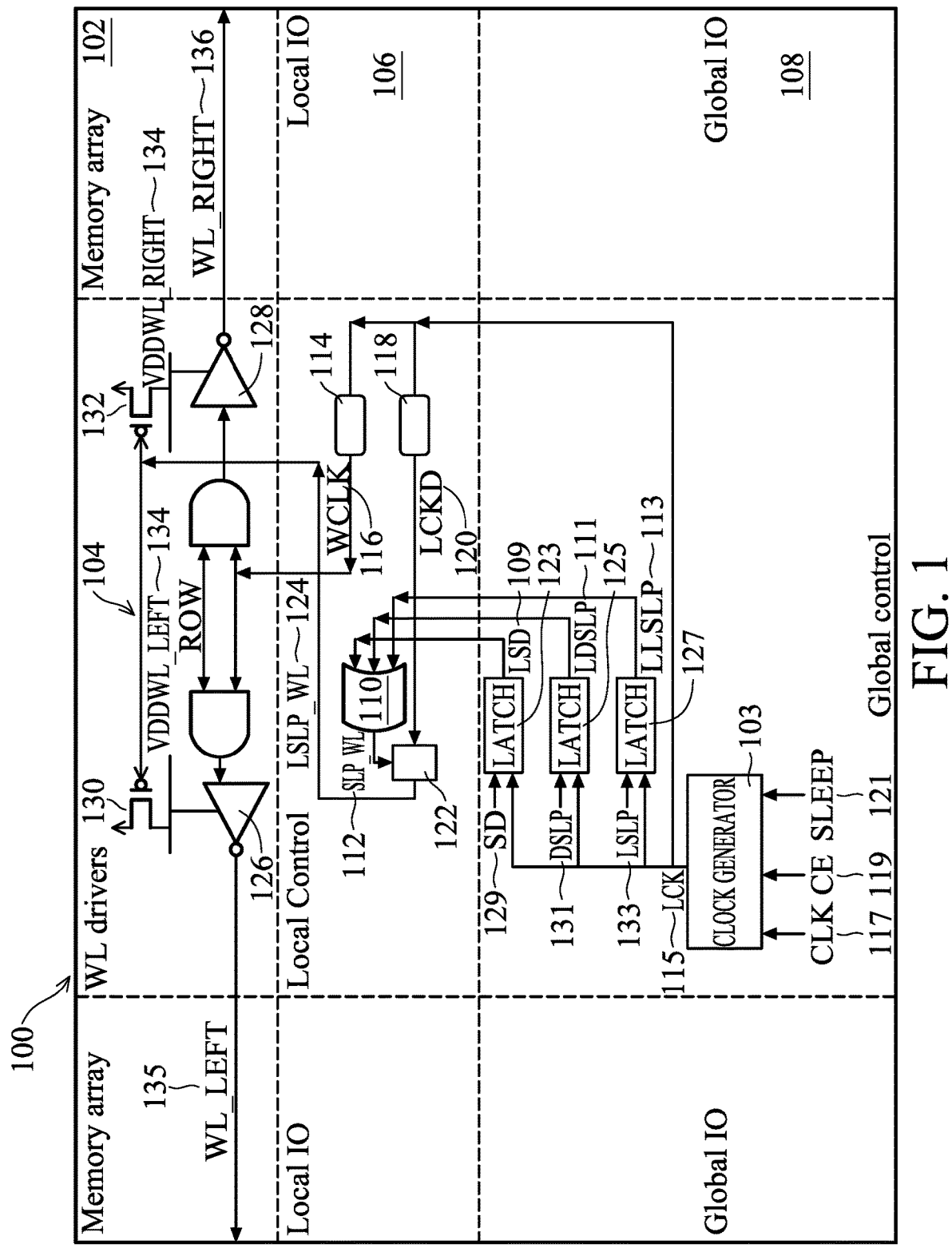
FIG. 1 is a diagram of an example power assertion circuit for a semiconductor memory in accordance with embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Systems and methods for power management in a memory system are described herein. In embodiments, the technology described and illustrated in the present disclosure may provide a robust power management assertion scheme for a memory system that operates to turn off a word line header supply only after a current read/write operation is completed.

FIG. 1 is a diagram of an example power assertion circuit 100 for a semiconductor memory (e.g., SRAM) in accordance with embodiments. The example power assertion circuit 100 includes a memory array 102 having a memory cell 104 that is controlled by a local input/output (I/O) system 106 and a global I/O system 108. The global I/O system 108 generates or receives a plurality of power management control signals 109, 111, and 113, as well as a local clock signal 115. For example, in the illustrated embodiment, the global I/O system 108 includes a clock generator 103 that generates the local clock signal (LCK) 115 as a function of a sleep signal 121, a clock (CLK) signal 117 and a chip enable (CE) signal 119. For example, in an embodiment, the clock generator 103 may cause the local clock signal (LCK) 115 to follow the clock (CLK) signal 117 when both the chip enable (CE) signal 119 and sleep signal (121) are in a logic high state, and may interrupt the local clock signal (LCK) 115 output when either the chip enable (CE) signal 119 or the sleep signal (121) is in a logic low state. The local clock signal (LCK) 115 is used to clock latch circuits 123, 125 and 127. A first latch circuit 123 latches a shut down (SD) control signal 129 to generate a latched shut down (LSD) control signal 109. A second latch circuit 125 latches a deep sleep (DSLP) control signal 131 to generate a latched deep sleep (LDSLP) control signal 111. A third latch circuit 127 latches a light sleep (LSLP) control signal 133 to generate a latched light sleep (LLSLP) control signal 113. The latch circuits may, for example, be positive phase latches.

The local I/O system 106 includes a logic (OR) gate 110 that generates a word line sleep signal (SLP_WL) 112 as a function of the power management control signals (LSD, LDSLP, LLSLP) 109, 111 and 113, a decoder 114 that generates a word line clock (WCLK) signal 116 as a function of the local clock signal (LCK) 115, and a logic circuit 118 that generates a delayed local clock signal (LCKD) signal 120 as a function of the local clock signal (LCK) 115. The decoder 114 may, for example, be an SRAM predecoder that receives a plurality of address lines (not shown) in addition to the local clock signal (LCK) 115, and generates the word line clock (WCLK) signal 116 in a known manner to drive the memory cell 104 when selected based on the address lines. The time required for the decoder 114 to perform this operation causes some amount of time delay between the local clock signal (LCK) 115 and the word line clock (WCLK) signal 116, as shown for example in FIG. 2. In order to account for this time delay, the logic circuit 118 is configured to implement a delay in the delayed local clock signal (LCKD) signal 115 that is based on the time delay caused by operation of the decoder 114. The logic circuit 118 may, for example, be a delay circuit that is generated by a series of an even number of buffers (e.g., inverters), where the number of inverters is selected based on the time delay caused by operation of the decoder 114. The local I/O system 106 further includes a latch circuit 122 that generates a local word line sleep signal (LSLP_WL) 124 in response to the word line sleep signal (SLP_WL) 112 and delayed local clock (LCKD) signal 120.

The memory array 102 includes a pair of word line drivers 126, 128 for the memory cell 104 and switching circuitry 130, 132 that is configured to control power to the word line drivers 126, 128 in response to the local word line sleep signal (LSLP_WL) 124, as detailed below. In addition, the word line clock signal (WCLK) 116 is received by the memory cell 104 for clocking memory read/write operations. In the illustrated embodiment, the word line driver switching circuitry includes a pair of PMOS transistors 130 and 132, each with a gate terminal coupled to the local word line sleep signal (LSLP_WL) 124, a source terminal coupled to a supply voltage, and a drain terminal coupled to the word line header supply terminal 134 for the respective word line driver 126 and 128. In the illustrated embodiment, when the local word line sleep signal (LSLP_WL) 124 is in a logic high state, the PMOS transistors 130 and 132 will turn off the word line header supply 134, putting the memory cell 104 into a power management (e.g., sleep) condition.

In operation, the latch circuit 122 synchronizes the local sleep signal (SLP_WL) 112 with the delayed local clock signal (LCKD) 120 such that the local word line sleep signal (LSLP_WL) 124 is prevented from turning off the word line header supply 134 until after the word line clock (WCLK) 116 is disabled, indicating that any current read/write operation is completed. For example, the latch circuit 122 may be configured to trigger on the falling edge of the delayed local clock signal (LCKD) 120 which, as explained above, includes a delay that is based on the time required for the decoder 114 to complete its operation. In this manner, the delayed local clock signal (LCKD) 120 will not trigger the latch circuit 122 to pass the local sleep signal (SLP_WL) 112 through as the local word line sleep signal (LSLP_WL) 124 until receiving a falling edge of the delayed local clock signal (LCKD) 120, which will not occur until after the read/write operation initiated by the decoder 114 has completed. An example operation of the power assertion circuit 100 is illustrated in FIG. 2.

Figure 2:
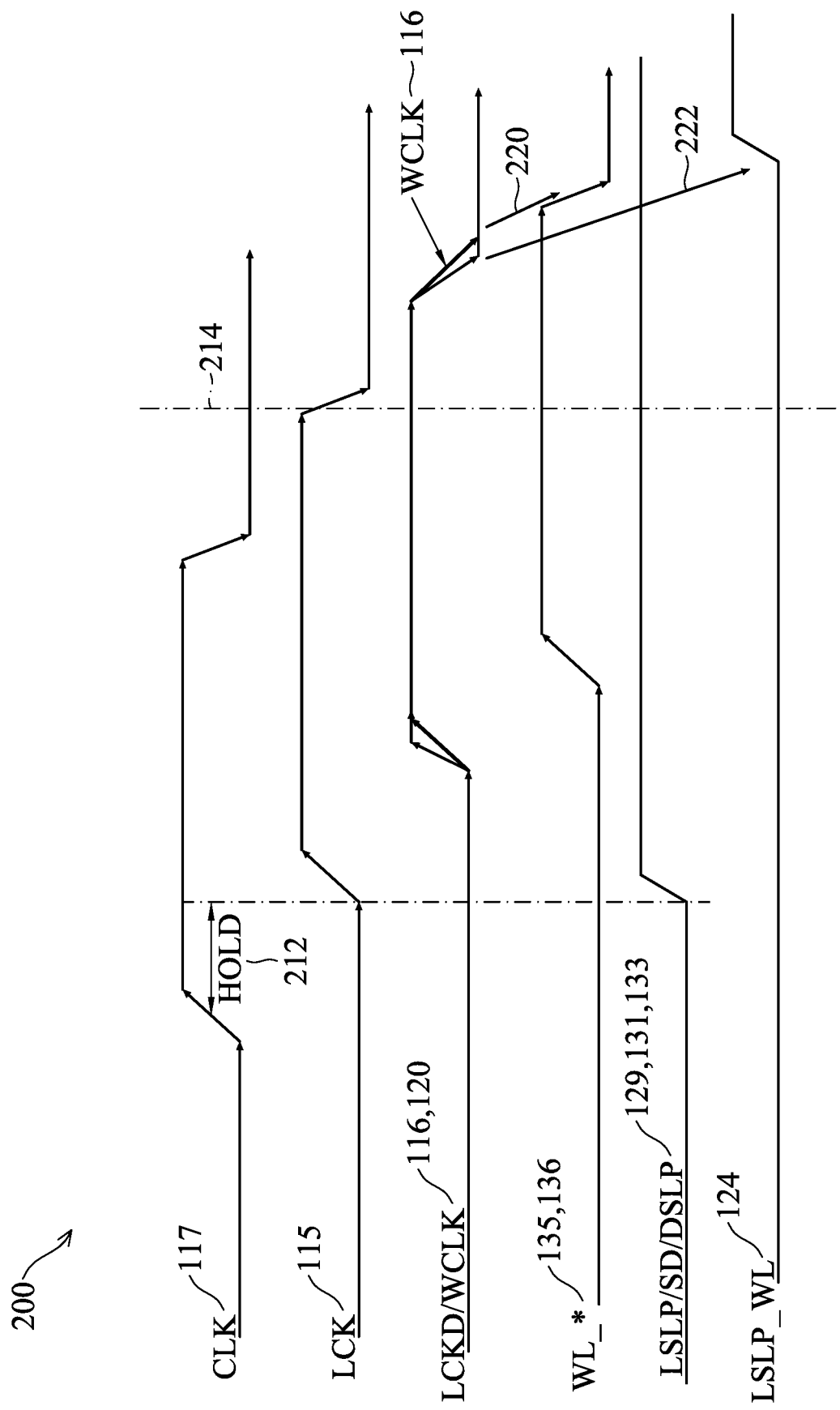
FIG. 2 is a timing diagram that illustrates an example operation of the power assertion circuit of FIG. 1 in accordance with embodiments.

FIG. 2 is a timing diagram 200 that illustrates an example operation of the power assertion circuit 100 of FIG. 1 in accordance with embodiments. The example operation illustrated in the timing diagram 200 of FIG. 2 is synchronized to a memory clock signal (CLK) 117. The local clock signal (LCK) 115 and power assertion control signals (SD, DSLP, LSLP) 129, 131, 133 may be generated as a function of the clock signal (CLK) 117, for example as described above with reference to FIG. 1. The hold time 212 shown in FIG. 2 is to allow the latch circuits 123, 125, 127 (shown in FIG. 1) to stabilize.

As shown in FIG. 2, a logic high state on the local clock signal 115 causes the LCKD 120 and WCLK 116 signals to transition to a logic high state after a short delay, for example based on the operations of the decoder 114 and logic circuit 188 described above with reference to FIG. 1. The logic high state on the word line clock signal (WCLK) 116 enables read or write operations to be performed on the memory cell 104 of FIG. 1, as shown in the timing diagram 200 of FIG. 2 by the transition of the word lines (WL*) 135, 136 to a logic high state.

At time 214 in the example timing diagram 200, the local clock signal (LCK) 115 transitions back to a logic low state. As shown, this causes the LCKD 120 (generated by logic circuit 118 in FIG. 1) and WCLK 116 (generated by decoder 114 in FIG. 1) to also transition to a logic low state after a short delay, as detailed above with reference to FIG. 1. When the word line clock (WCLK) 116 transitions back to a logic low state, the read/write operations (of memory cell 104 in FIG. 1) are complete, as shown in the timing diagram 200 by the transition of the memory cell word lines (WL*) 134, 136 at reference 220. In addition, the falling edge of the LCKD signal 120 in combination with the logic high state on the power management control signals (LSLP/SD/DSLP) 109, 111, 113 triggers the latch circuit 122 in FIG. 1 to generate a logic high state on the local word line sleep signal (LSLP_WL) 124, as shown at reference 222 in FIG. 2. In this way, the local word line sleep signal (LSLP_WL) 124 output by the latch circuit 122 in FIG. 1 does not transition to a logic high state (causing the word line header supply 134 in FIG. 1 to turn off) until after the read/write operation on the memory cell word lines (WL*) 134, 136 has completed.

Figure 3:
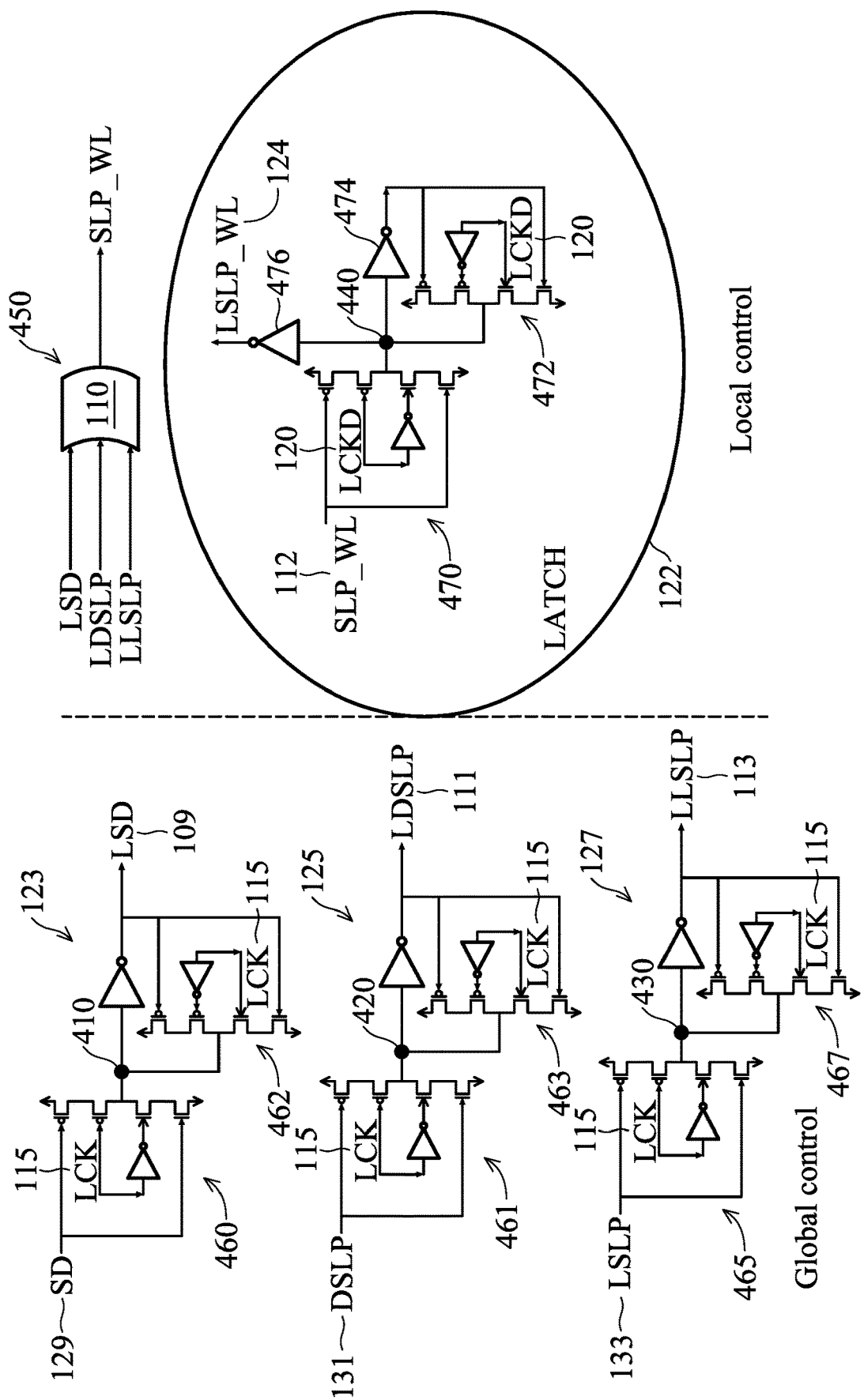
FIG. 3 is a circuit diagram that shows an example implementation for certain functions in the global I/O system and local I/O system in FIG. 1 in accordance with embodiments.

FIG. 3 is a circuit diagram that shows an example of how certain logic functions in the global I/O system 108 and local I/O system 106 in FIG. 1 may be implemented in accordance with embodiments. Specifically, the left-hand side of FIG. 3 shows example circuit implementations for the latch circuits 123, 125 and 127 shown in FIG. 1 for generating the power management control signals, LSD 109, DLSLP 111, and LLSLP 113. The right-hand side of FIG. 3 shows an example circuit implementation for the latch circuit 122 of FIG. 1, and an example logic circuit 450 for generating the local sleep signal (SLP_WL) 112.

With reference first to the latch circuits 123, 125, 127 in the global I/O system 108, each of these circuits has the same circuit configuration that includes a first set of four transistors that implement a feedforward circuit, and a second set of four transistors that implement a feedback circuit. Latch circuit 123 latches the shut down signal 129 on the falling edge of the local clock signal (LCK) 115 to generate the latched shut down (LSD) control signal 109. Specifically, the transistors in the feedforward circuit 460 pass an inversion of the shut down (SD) signal input 129 through to node 410 when the local clock signal (LCK) 115 is in a logic low state, and the transistors in the feedback circuit 462 pass an inversion of the latched shut down (LSD) output 109 to node 410 when the local clock signal (LCK) 115 is in a logic high state. The signal at node 410 is inverted to generate the latched shut down (LSD) control signal 109.

Latch circuit 125 latches the deep sleep (DSLP) signal 131 on the falling edge of the local clock signal (LCK) 115 to generate the latched deep sleep (LDSLP) control signal 111. Specifically, the transistors in the feedforward circuit 461 pass an inversion of the deep sleep (DSLP) signal input 131 through to node 420 when the local clock signal (LCK) 115 is in a logic low state, and the transistors in the feedback circuit 463 pass an inversion of the latched deep sleep (DSLP) output 111 to node 420 when the local clock signal (LCK) 115 is in a logic high state. The signal at node 420 is inverted to generate the latched deep sleep (LDSLP) control signal 111.

Latch circuit 127 latches the light sleep signal 133 on the falling edge of the local clock signal (LCK) 115 to generate the latched light sleep (LLSLP) control signal 113. Specifically, the transistors in the feedforward circuit 465 pass an inversion of the light sleep (LSLP) signal input 133 through to node 430 when the local clock signal (LCK) 115 is in a logic low state, and the transistors in the feedback circuit 467 pass an inversion of the latched light sleep (LLSLP) output 113 to node 430 when the local clock signal (LCK) 115 is in a logic high state. The signal at node 430 is inverted to generate the latched light sleep (LLSLP) control signal 113.

With reference to the example implementation of latch circuit 122 shown on the right-hand side of FIG. 3, the example latch circuit implementation 122 includes a first set of four transistors that implement a feedforward circuit 470, and a second set of four transistors that implement a feedback circuit 472. The latch circuit 122 latches the local sleep signal (SLP_WL) 112 on the falling edge of the delayed local clock signal (LCKD) 120 to generate the local word line sleep signal (LSLP_WL) 124. Specifically, the transistors in the feedforward circuit 470 pass an inversion of the local sleep signal (SLP_WL) 112 through to node 440 when the delayed local clock signal (LCKD) 120 is in a logic low state. The signal at node 440 is inverted with a first inverter 474 to generate an input to the feedback circuit 472, which is fed back to node 440 when the delayed local clock signal (LCKD) 120 is in a logic high state. The signal at node 440 is also inverted by a second inverter 476 to generate the local word line sleep signal (LSLP_WL) 124.

Figure 4:
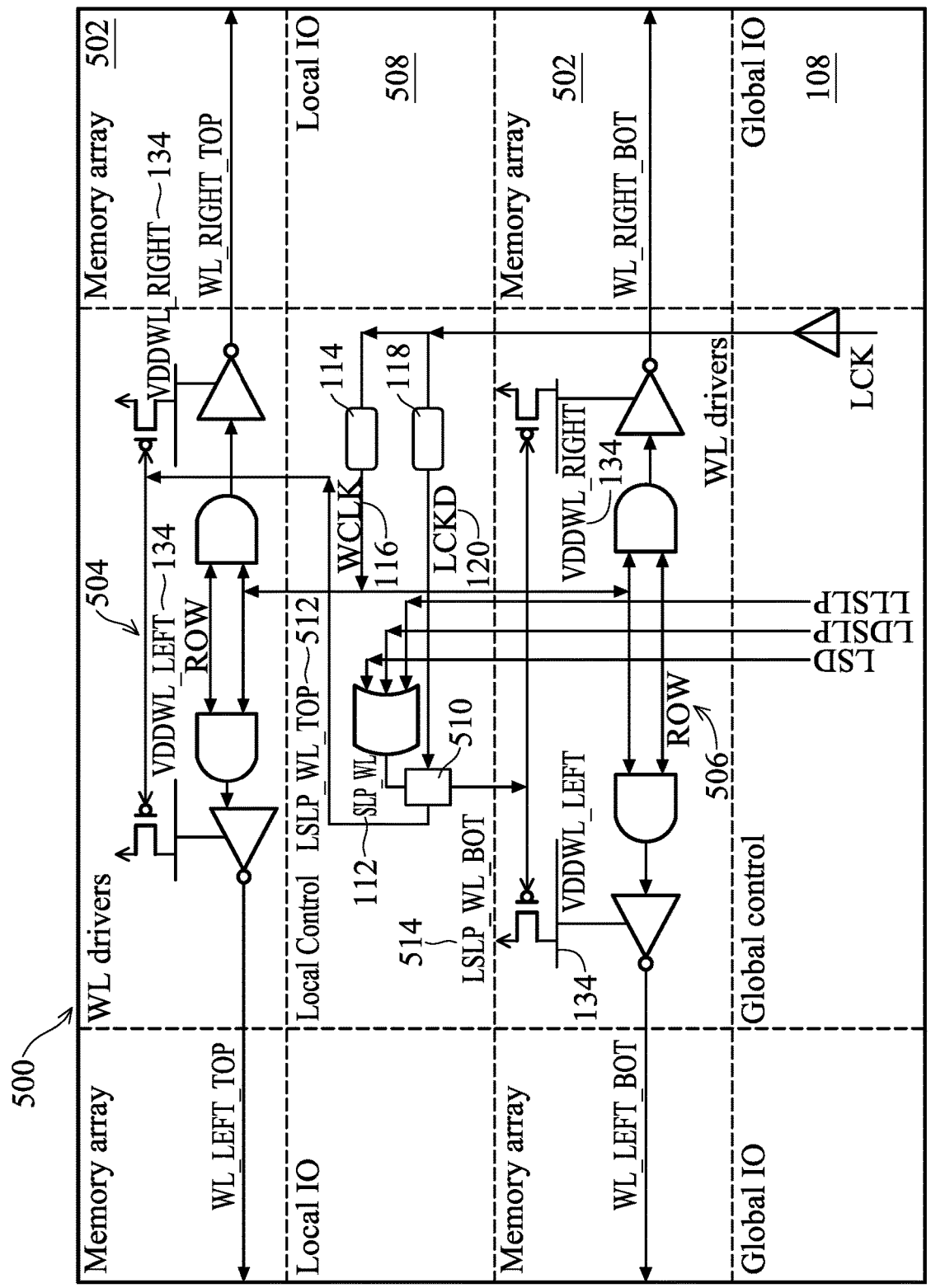
FIG. 4 is a diagram of another example power assertion circuit for a semiconductor memory in accordance with embodiments.

FIG. 4 is a diagram of another example power assertion circuit 500 for a semiconductor memory (e.g., SRAM) in accordance with embodiments. The example power assertion circuit 500 is similar to the example 100 shown in FIG. 1, except that in this embodiment 500 the memory array 502 includes two memory cells 504 and 506 that are controlled by the same local I/O system 508. Specifically, the latch circuit 510 in this embodiment 500 generates two local word line sleep signals—a first local word line sleep signal (LSLP_WL_TOP) 512 for the first (top) memory cell 504, and a second local word line sleep signal (LSLP_WL_BOT) 514 for the second (bottom) memory cell 506.

Like the embodiment described above with reference to FIG. 1, the local word line sleep signals (LSLP_WL_TOP and LSLP_WL_BOT) 512, 514 are generated in response to the word line sleep signal (SLP_WL) 112 and LCKD signal 120 such that the local word line sleep signals 512 and 514 are prevented from turning off the word line header supply 134 until after the word line clock (WCLK) 116 is disabled, indicating that any current read/write operations are completed. For example, the latch circuit 510 may be configured to trigger on the falling edge of the delayed local clock signal (LCKD) 120 which, as explained above, includes a delay that is based on the time required for the decoder 114 to complete its operation. In this manner, the delayed local clock signal (LCKD) 120 will not trigger the latch circuit 510 to pass the local sleep signal (SLP_WL) 112 through as the local word line sleep signals (LSLP_WL_TOP and LSLP_WL_BOT) 512, 514 until receiving a falling edge of the delayed local clock signal (LCKD) 120, which will not occur until after the read/write operation initiated by the decoder 114 has completed.

Figure 5:
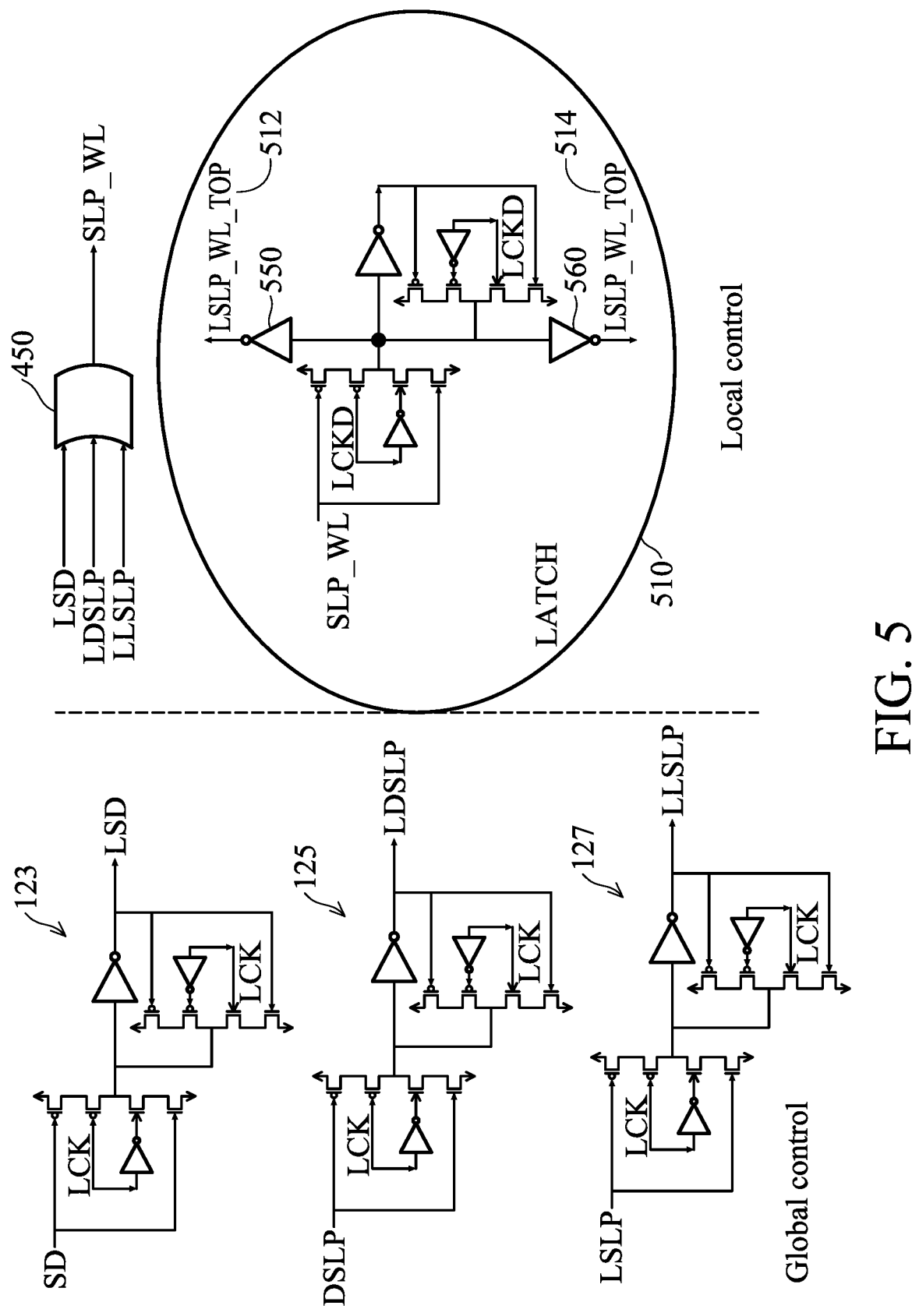
FIG. 5 is a circuit diagram that shows an example of how certain logic functions in the global I/O system and local I/O system in FIG. 4 may be implemented in accordance with embodiments.

FIG. 5 is a circuit diagram that shows an example of how certain logic functions in the global I/O system 108 and local I/O system 506 in FIG. 4 may be implemented in accordance with embodiments. The latch circuit implementations 123, 125, and 127 shown in FIG. 5 are the same as shown in FIG. 3. The latch circuit 510 implementation shown in FIG. 5 is similar to the example shown in FIG. 3, except that this embodiment 510 includes two output inverters 550 and 560 that respectively provide the first and second local word line sleep signals (LSLP_WL_TOP and LSLP_WL_BOT) 512, 514. Specifically, the latch circuit 510 latches the local sleep signal (SLP_WL) 112 on the falling edge of the delayed local clock signal (LCKD) 120 in the same manner as described above with reference to the latch circuit 122 in FIG. 3. In this embodiment 510, however, an additional output inverter 560 is included so that the generated local word line sleep signal may be provided as a first local word line sleep signal (LSLP_WL_TOP) 512 for the first (top) memory cell 504 in FIG. 4, and a second local word line sleep signal (LSLP_WL_BOT) 514 for the second (bottom) memory cell 506 in FIG. 4.

Figure 6:
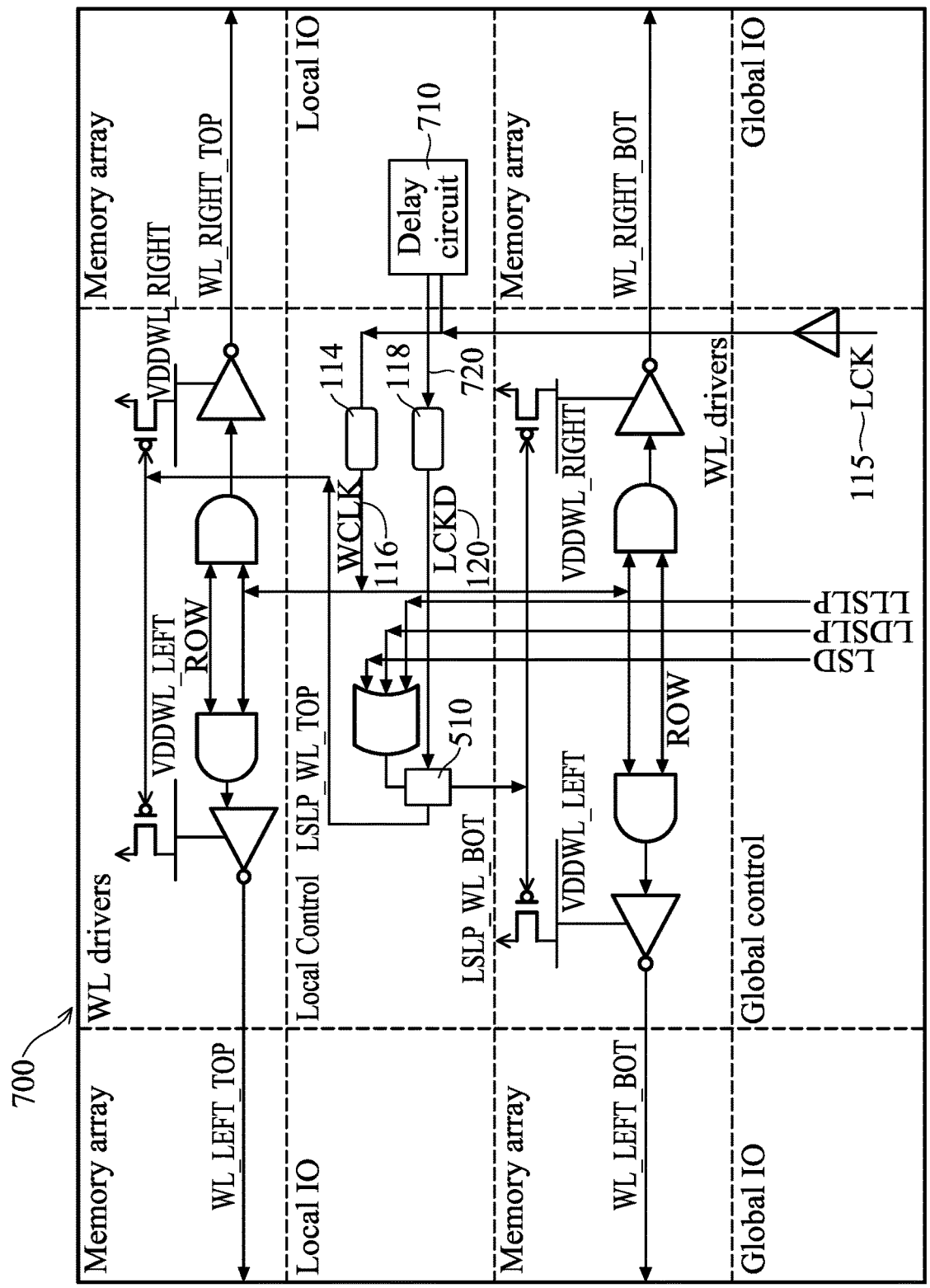
FIG. 6 is a diagram of a third example power assertion circuit for a semiconductor memory in accordance with embodiments.

FIG. 6 is a diagram of a third example power assertion circuit 700 for a semiconductor memory (e.g., SRAM) in accordance with embodiments. The example 700 shown in FIG. 6 is the same as the example power assertion circuit 500 shown in FIG. 4, except that this embodiment 700 also includes an additional delay circuit 710 that is coupled between the local clock signal (LCK) 115 and logic circuit 118. The delay circuit 710 adds an additional delay to the local clock signal (LCK) 115 to generate a delayed local clock signal 720 that is input to the logic circuit 118. The delay circuit 710 may, for example, be configured to delay the clock (LCKD) 120 to the latch circuit 122 to match delay an RC line delay in the decoder circuit 114 and/or WCLK line 116. In embodiments, the delay circuit 710 may include a series of an even number of inverters, with the number of inverters selected to create the desired signal delay.

Figure 7:
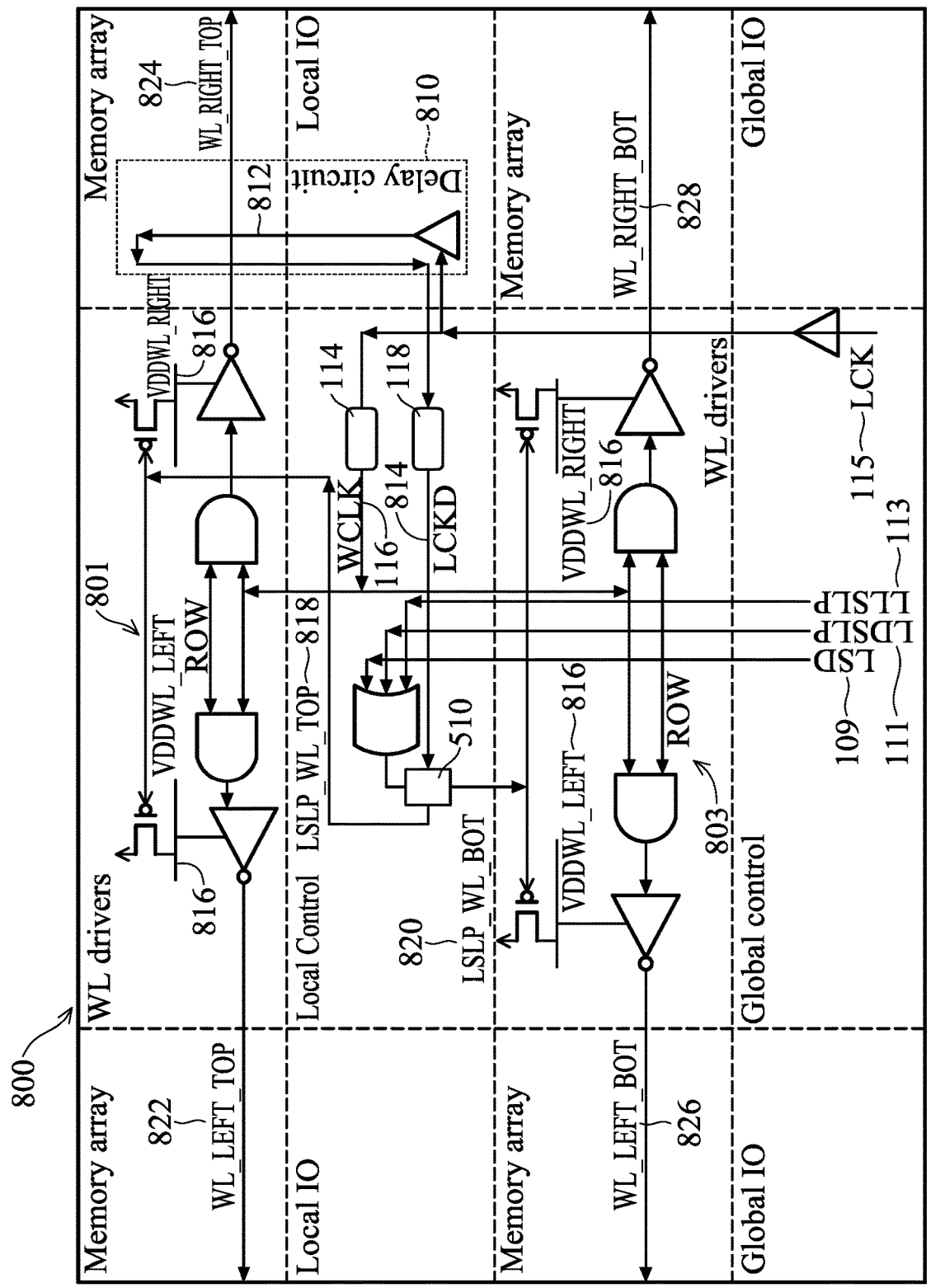
FIG. 7 is a diagram of a fourth example power assertion circuit for a semiconductor memory in accordance with embodiments.

FIG. 7 is a diagram of a fourth example power assertion circuit 800 for a semiconductor memory (e.g., SRAM) in accordance with embodiments. The example 800 shown in FIG. 7 is the same as the example power assertion circuit 700 shown in FIG. 6, except that the delay circuit 810 is implemented using a delay tracking element 812. The delay tracking element 812 may, for example, be configured to match a line delay in the decoder circuit 114 and/or WCLK line 116. The delay tracking element 812 may, for example, be implemented using an inverter chain and/or a length of conductive trace material. The length (resistance) of the conductive trace may, for example, be selected to track the delay caused by line resistance of the decoder circuit 114 and/or WCLK line 116, and the number of inverters in the inverter chain may, for example, be selected by running timing simulations based on memory cycle time (clock frequency).

Figure 8:
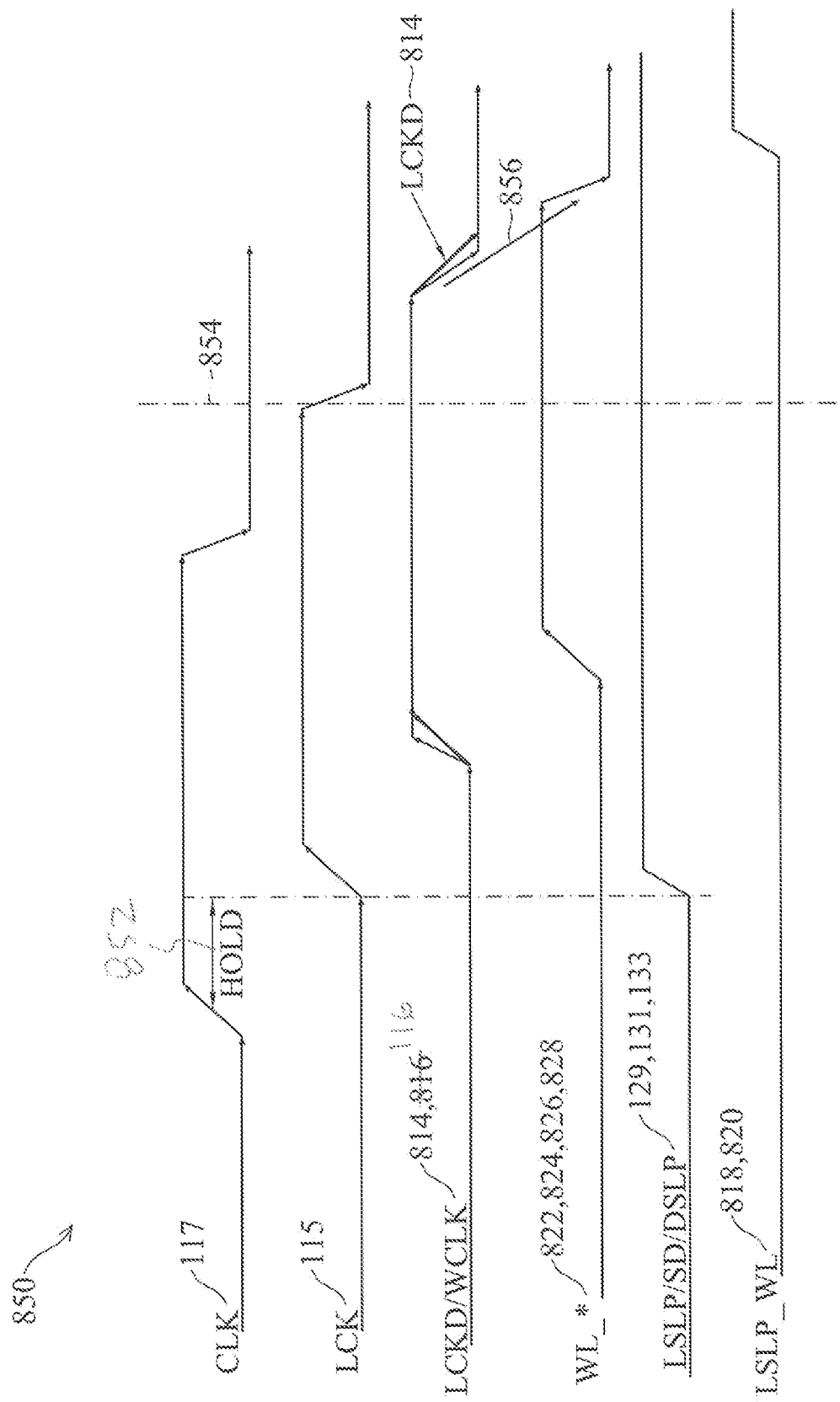
FIG. 8 is a timing diagram that illustrates an example operation of the power assertion circuit of FIG. 7 in accordance with embodiments.

FIG. 8 is a timing diagram 850 that illustrates another example operation of the power assertion circuit 800 of FIG. 7 in accordance with embodiments. The example operation illustrated in the timing diagram 850 of FIG. 8 is synchronized to a memory clock signal (CLK) 117. The local clock signal (LCK) 115 and power assertion control signals (SD, DSLP, LSLP) 129, 131, 133 may be generated as a function of the clock signal (CLK) 117, for example as described above with reference to FIG. 1. The hold time 852 shown in FIG. 8 is to allow the latch circuits 123, 125, 127 (shown in FIG. 1) to stabilize.

As shown in FIG. 8, a logic high state on the local clock signal 115 causes the LCKD 814 and WCLK 116 signals to transition to a logic high state after a short delay, for example based on the operations of the decoder 114, logic circuit 118 and delay circuit 810 described above. The logic high state on the word line clock signal (WCLK) 116 enables read or write operations to be performed on the memory cells 801, 803, as shown in the timing diagram 850 of FIG. 8 by the transition of the word lines (WL*) 822, 824, 826, 828 to a logic high state.

At time 854 in the example timing diagram 850, the local clock signal (LCK) 115 transitions back to a logic low state. As shown, this causes the LCKD 814 (generated by logic circuit 118 in FIG. 7) and WCLK 116 (generated by decoder 114 in FIG. 7) to also transition to a logic low state after a short delay, as detailed above. When the word line clock (WCLK) 116 transitions back to a logic low state, the read/write operations (of the memory cells 801 and 803 in FIG. 7) are complete, as shown in the timing diagram 850 by the transition of the memory cell word lines (WL*) 822, 824, 826, 828 at reference 856. In addition, the falling edge of the LCKD signal 814 in combination with the logic high state on the power management control signals (LSLP/SD/DSLP) 129, 131, 133 triggers the latch circuit 510 in FIG. 7 to generate a logic high state on the local word line sleep signals (LSLP_WL) 818, 820. In this way, the local word line sleep signals (LSLP_WL) 818, 820 output by the latch circuit 510 in FIG. 7 do not transition to a logic high state (causing the word line header supply 816 in FIG. 7 to turn off) until after the read/write operation on the memory cell word lines (WL*) 822, 824, 826, 828 has completed.

Figure 9:
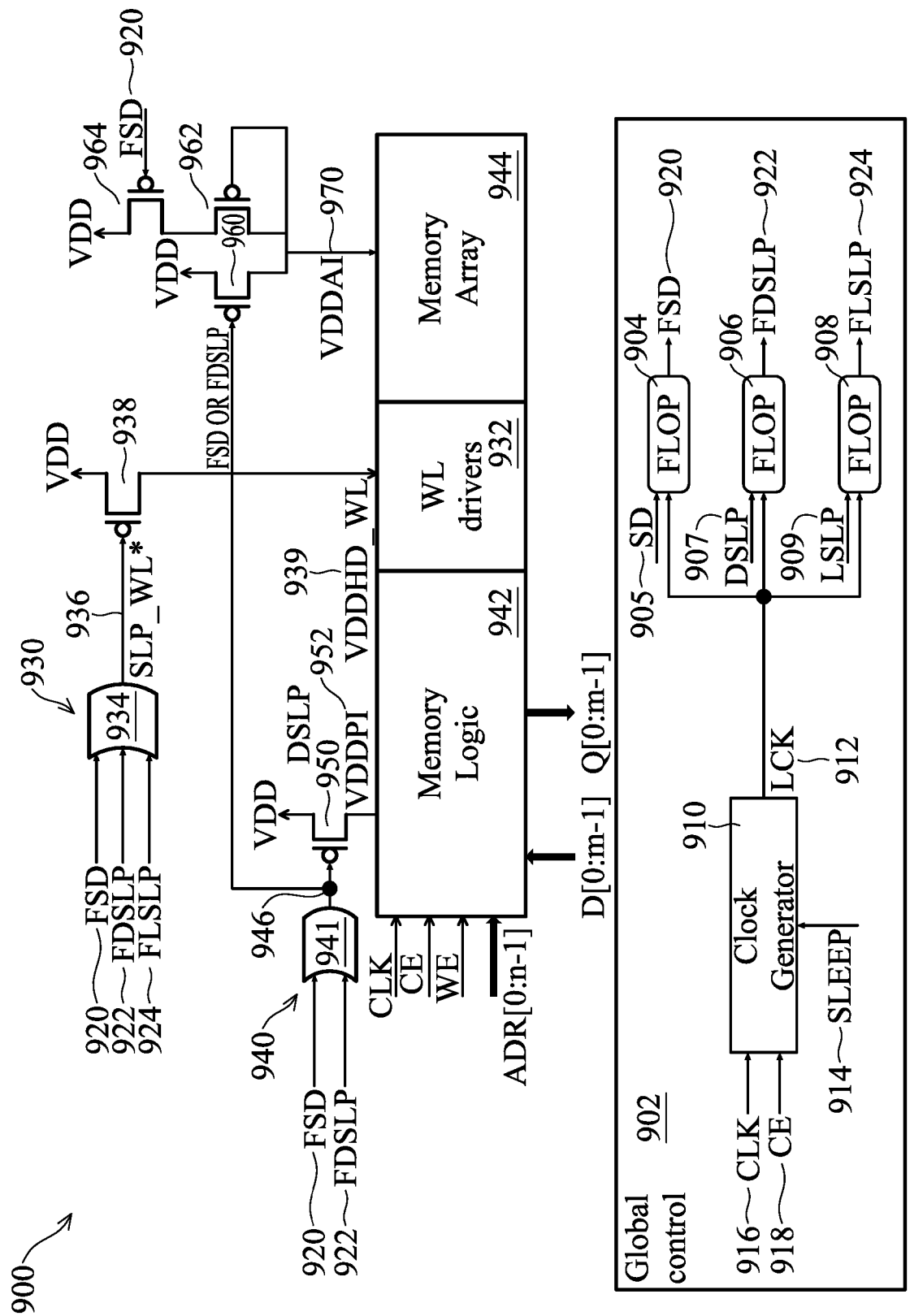
FIG. 9 is a diagram of a fifth example power assertion circuit for a semiconductor memory in accordance with embodiments.

FIG. 9 is a diagram of a fifth example power assertion circuit 900 for a semiconductor memory (e.g., SRAM) in accordance with embodiments. In this embodiment 900 the global I/O system 902 includes flop circuits 904, 906, 908 on the power management control signals (SD, DSLP and LSLP). The flop circuits 904, 906, 908 are triggered on the leading edge of the clock signal (LCK) 912, unlike latch circuit (e.g., latches 123, 125 and 127 in FIG. 1) which are triggered on the falling edge of the clock. As shown in the timing diagram set forth in FIG. 10, latching the power management control signals 920, 922, 924 (FSD, DSLP, and FLSLP) at the rising edge of the clock with flop circuits 904, 906, 908 further delays the assertion of the word line sleep signal 936, providing a race free design margin with respect to the read/write operations on the memory cell word line (WL*) 936.

The global I/O system 902 in the illustrated embodiment 900 includes a clock generator 910 that generates a local clock signal (LCK) 912 as a function of a sleep signal 914, clock signal 916 and chip enable signal 918. For example, in an embodiment, the clock generator 910 may cause the local clock signal (LCK) 912 to follow the clock (CLK) signal 916 when both the chip enable (CE) signal 918 and sleep signal 914 are in a logic high state, and may interrupt the local clock signal (LCK) 912 when either the chip enable (CE) signal 918 or the sleep signal 914 are in a logic low state. The local clock signal (LCK) 912 is used to clock the flop circuits 904, 906 and 908. Specifically, a first flop circuit 904 latches the SD control signal 905 on the rising edge of the local clock signal (LCK) 912 to generate an FSD control signal 920, a second flop circuit 906 latches the DSLP control signal 907 on the rising edge of the local clock signal (LCK) 912 to generate an FDSLP control signal 922, and a third flop circuit 908 latches the LSLP control signal 909 on the rising edge of the local clock signal (LCK) 912 to generate an FLSLP control signal 924.

The three power management control signals (FSD, FDSLP and FLSLP) 920, 922, 924 are input to a first power control circuit 930 that controls power assertion to the word line drivers. In addition, the FSD control signal 920 and the FDSLP control signal 922 are input to a second power control circuit 940 that controls power assertion to a memory logic circuit 942 and the memory array 944. The first power control circuit 930 includes a first logic (OR) gate 934 that generates a word line sleep signal 936 as a function of the three power management control signals (FSD, FDSLP and FLSLP) 920, 922, 924. The word line sleep signal 936 is received at the gate terminal of a first PMOS transistor 938 that controls Vdd power assertion to the word line header supply 939.

The second power control circuit 940 includes a second logic (OR) gate that generates a second sleep signal 946 for controlling power assertion to the memory logic 942 and memory array 944. The second sleep signal 946 is received at the gate terminal of a second PMOS transistor 950 that controls Vdd power assertion to a power line (VDDPI) 952 for the memory logic 942. Specifically, the second PMOS transistor 950 will provide Vdd power to the power line (VDDPI) 952 when the second sleep signal 946 is in a logic low state.

The second sleep signal 946 is also received at a first input to a set of PMOS transistors 960, 962, 964 that are configured as a two input logic circuit. The FSD control signal 920 is received at a second input to the logic circuit formed by the set of PMOS transistors 960, 962, 964. In operation, the logic circuit formed by the set of PMOS transistors 960, 962, 964 controls Vdd power assertion to a power line (VDDAI) 970 for the memory array 944 as a function of the second sleep signal 946 and the SD control signal 905. Specifically, the logic circuit 960, 962, 964 will provide Vdd power to the power line (VDDAI) 970 when the second sleep signal 946 is in a logic low state.

Figure 10:
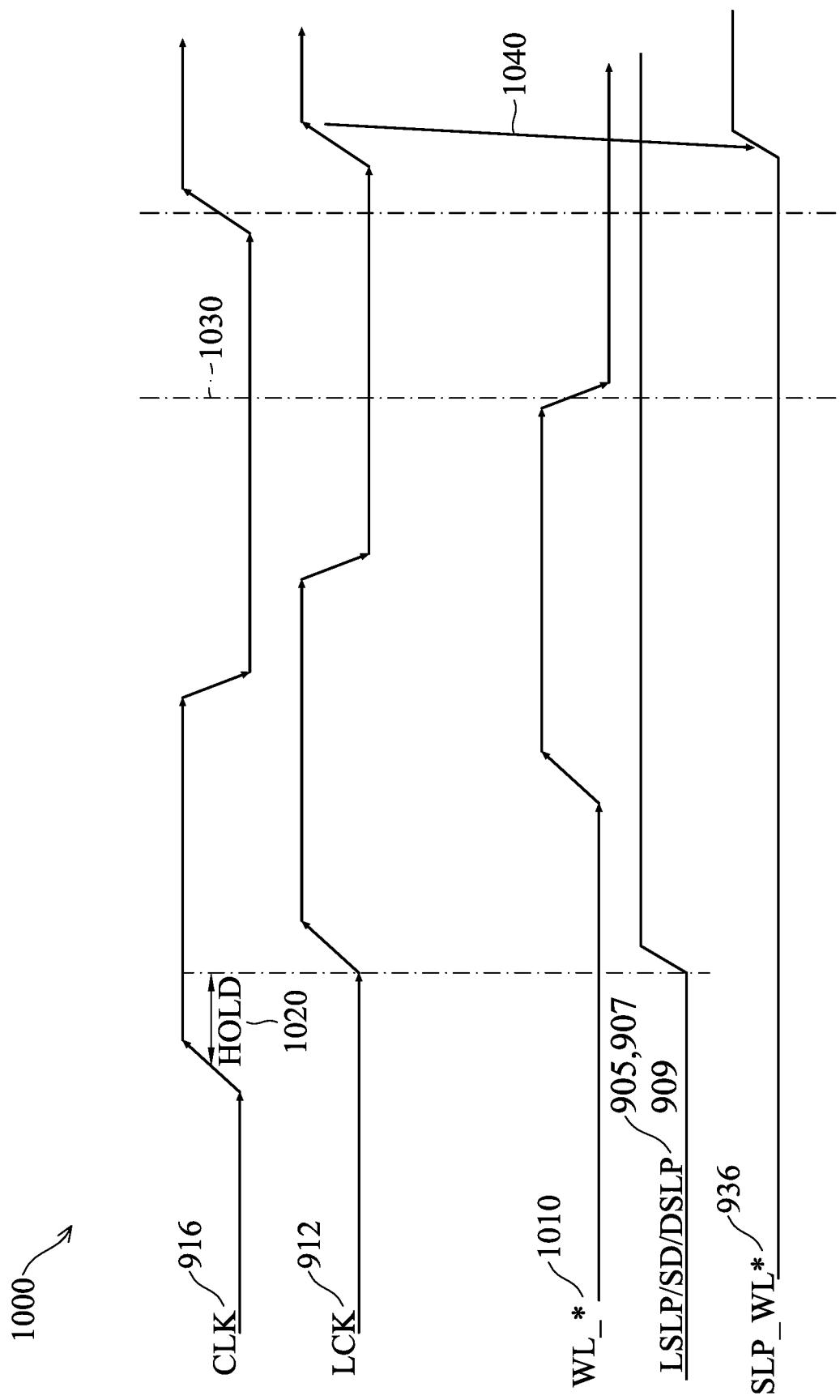
FIG. 10 is a timing diagram that shows an example operation of the power assertion circuit shown in FIG. 9 in accordance with embodiments.

FIG. 10 is a timing diagram 1000 that shows an example operation of the power assertion circuit shown in FIG. 9 in accordance with embodiments. As shown in the timing diagram 1000, the clock signal (LCK) 916 and power management control signals (SD, DSLP, LSLP) 905, 907, 909 may be generated as a function of the memory clock signal (CLK) 916, for as describe described above with reference to FIG. 9. The hold time 1020 shown in FIG. 10 is to allow the latch (flop) circuits 904, 906, 908 (shown in FIG. 9) to stabilize.

In the example illustrated in FIG. 10, the word line sleep signal (SLP_WL*) 936 starts out in a logic low stage, providing power to the word line drivers 932 in FIG. 9 to enable read/write operations. During the first cycle of the local clock signal (LCK) 912 in the illustrated example, read/write operations are performed, as shown in the timing diagram 1000 by the transition of the word lines (WL*) 1010 to a logic high state. The read/write operations are complete at time 1030 in the illustrated example. In this example 1000, the power assertion control signals (SD, DSLP, LSLP) 905, 907, 909 are in a logic high state at time 1030, indicating that power to the word line drivers 932 in FIG. 9 should be turned off. However, because the flop circuits 904, 906, 908 in the global I/O system 902 of FIG. 9 are triggered on the rising edge of the local clock signal (LCK) 912, the word line sleep signal (SLP_WL*) 936 does not transition to a logic high state until the next cycle of the local clock signal 912, as shown at 1040 in FIG. 10.

Figure 11:
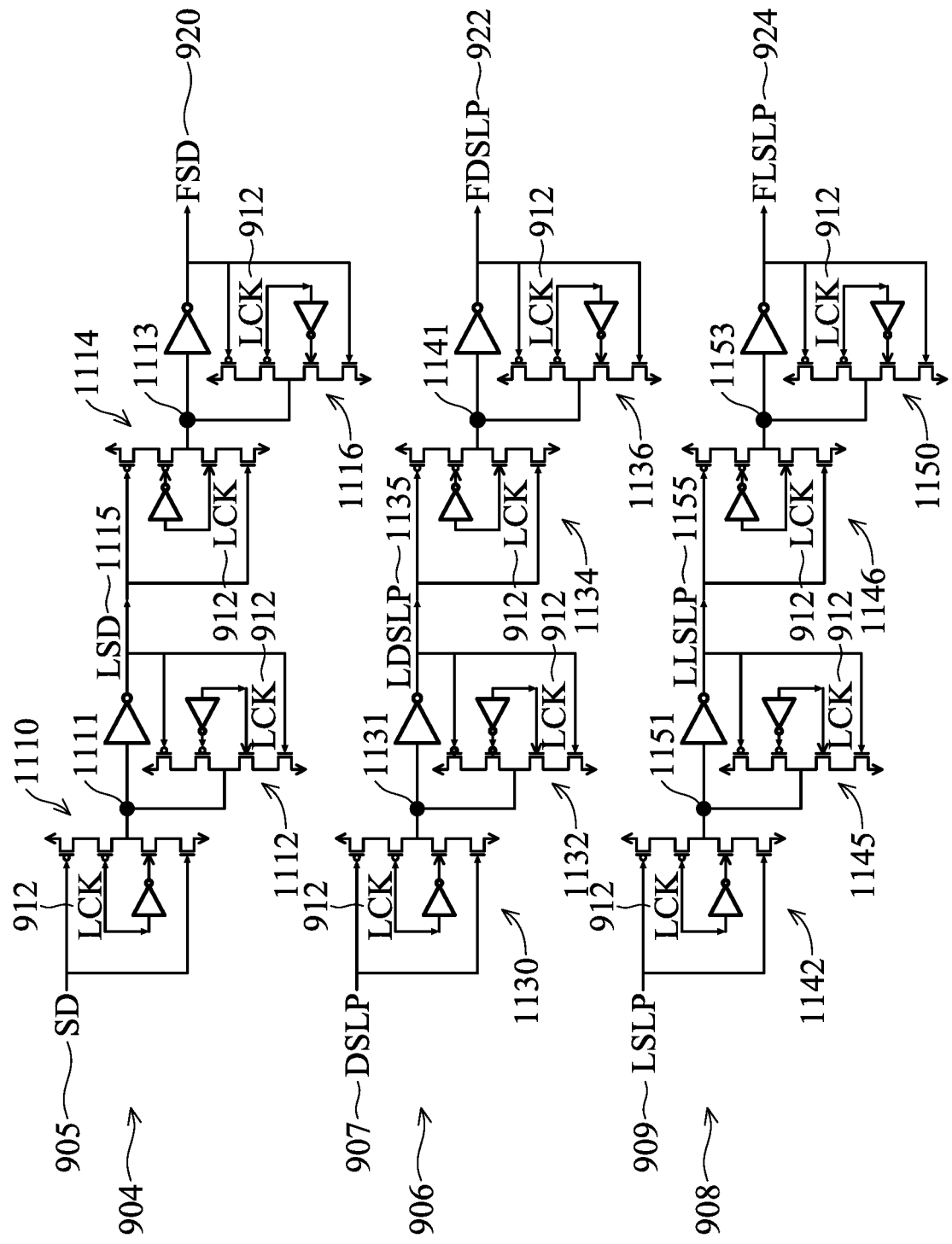
FIG. 11 shows example circuit implementations for the latch (flop) circuits in the global I/O system of FIG. 9 in accordance with embodiments.

FIG. 11 shows example circuit implementations for the flop circuits 904, 906, 908 in the global I/O system 902 of FIG. 9 in accordance with embodiments. Each of the flop circuits 904, 906, 908 shown in FIG. 11 has the same circuit configuration that includes a two back-to-back latch circuits.

The first flop circuit 904, includes a first latch circuit 1110, 1112 having a first feedforward circuit 1110 and a first feedback circuit 1112, followed by a second latch circuit 1114, 1116 having a second feedforward circuit 1114 and a second feedback circuit 1116. The first latch circuit 1110, 1112 latches the shut down signal 905 on the falling edge of the local clock signal (LCK) 912 to generate a latched shut down (LSD) signal 1115. Specifically, the transistors in the first feedforward circuit 1110 pass an inversion of the shut down signal (SD) 905 through to node 1111 when the local clock signal (LCK) 912 is in a logic low state, and the transistors in the first feedback circuit 1112 pass an inversion of the latched shut down (LSD) output 1115 to node 1111 when the local clock signal (LCK) 912 is in a logic high state. The signal at node 1111 is inverted to generate the latched shut down (LSD) signal 1115. The second latch circuit 1114, 1116 latches the latched shut down (LSD) signal 905 on the rising edge of the local clock signal (LCK) 912 to generate the FSD control signal 920. Specifically, the transistors in the second feedforward circuit 1114 pass an inversion of the latched shut down signal (LSD) 1115 through to node 1113 when the local clock signal (LCK) 912 is in a logic high state, and the transistors in the second feedback circuit 1116 pass an inversion of the FSD output 920 to node 1113 when the local clock signal (LCK) 912 is in a logic low state. The signal at node 1113 is inverted to generate the FSD control signal 920.

The second flop circuit 906, includes a first latch circuit 1130, 1132 having a first feedforward circuit 1130 and a first feedback circuit 1132, followed by a second latch circuit 1134, 1136 having a second feedforward circuit 1134 and a second feedback circuit 1136. The first latch circuit 1130, 1132 latches the deep sleep signal 907 on the falling edge of the local clock signal (LCK) 912 to generate a latched deep sleep signal (LDSLP) signal 1135. Specifically, the transistors in the first feedforward circuit 1130 pass an inversion of the deep sleep signal (DSLP) 907 through to node 1131 when the local clock signal (LCK) 912 is in a logic low state, and the transistors in the first feedback circuit 1132 pass an inversion of the latched deep sleep (LDSLP) output 1135 to node 1131 when the local clock signal (LCK) 912 is in a logic high state. The signal at node 1131 is inverted to generate the latched deep sleep (LDSLP) signal 1135. The second latch circuit 1134, 1136 latches the latched deep sleep signal (LDSLP) 1135 on the rising edge of the local clock signal (LCK) 912 to generate the FDSLP control signal 922. Specifically, the transistors in the second feedforward circuit 1134 pass an inversion of the latched deep sleep signal (LDSLP) 1135 through to node 1141 when the local clock signal (LCK) 912 is in a logic high state, and the transistors in the second feedback circuit 1136 pass an inversion of the FDSLP output 922 to node 1141 when the local clock signal (LCK) 912 is in a logic low state. The signal at node 1141 is inverted to generate the FDSLP control signal 922.

The third flop circuit 908, includes a first latch circuit 1142, 1145 having a first feedforward circuit 1142 and a first feedback circuit 1145, followed by a second latch circuit 1146, 1150 having a second feedforward circuit 1146 and a second feedback circuit 1150. The first latch circuit 1142, 1145 latches the light sleep signal 909 on the falling edge of the local clock signal (LCK) 912 to generate a latched light sleep signal (LLSLP) signal 1155. Specifically, the transistors in the first feedforward circuit 1142 pass an inversion of the light sleep signal (LSLP) 909 through to node 1151 when the local clock signal (LCK) 912 is in a logic low state, and the transistors in the first feedback circuit 1145 pass an inversion of the latched light sleep (LLSLP) output 1155 to node 1151 when the local clock signal (LCK) 912 is in a logic high state. The signal at node 1151 is inverted to generate the latched light sleep (LLSLP) signal 1155. The second latch circuit 1146, 1150 latches the latched light sleep signal (LLSLP) 1155 on the rising edge of the local clock signal (LCK) 912 to generate the FLSLP control signal 924. Specifically, the transistors in the second feedforward circuit 1146 pass an inversion of the latched light sleep signal (LLSLP) 1155 through to node 1153 when the local clock signal (LCK) 912 is in a logic high state, and the transistors in the second feedback circuit 1150 pass an inversion of the FLSLP output 924 to node 1153 when the local clock signal (LCK) 912 is in a logic low state. The signal at node 1153 is inverted to generate the FLSLP control signal 924.

Figure 12:
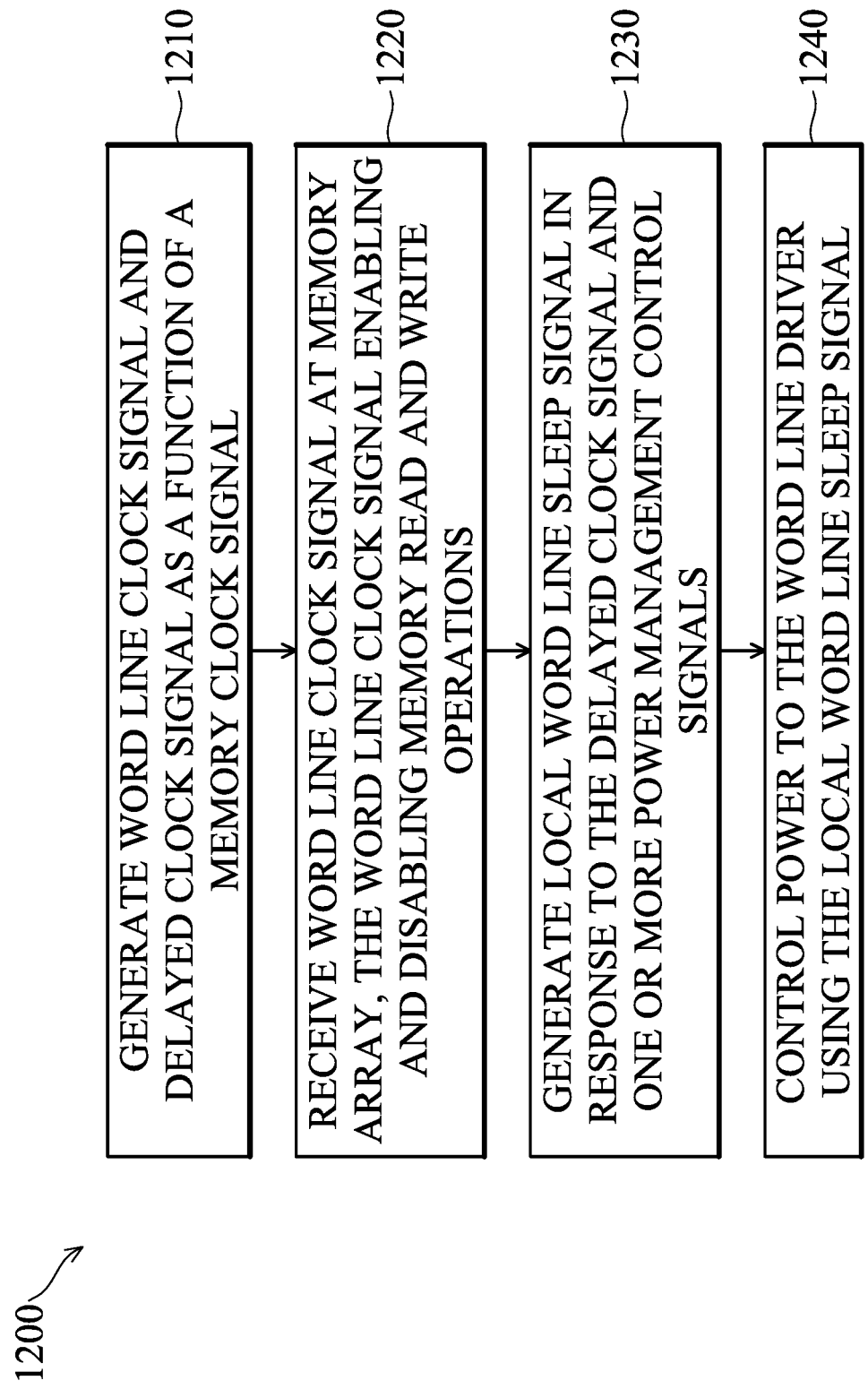
FIG. 12 is a flow diagram of an example method for controlling a sleep operation for a memory array in accordance with embodiments.

FIG. 12 is a flow diagram of an example method 1200 for controlling a sleep operation for a memory array that includes a memory cell and a word line driver in accordance with embodiments. The method 1200 may, for example, be performed by one of the example memory circuits shown in FIGS. 1, 4, 6, 7 and 9. At 1210, a word line clock signal and a delayed clock signal are generated a function of a memory clock signal. The word line clock signal may, for example, be generated by the decoder 114 shown in FIGS. 1, 4, 6 and 7. The delayed clock signal may, for example, be generated by the logic circuit 118 shown in FIGS. 1 and 6, by the combination of the logic circuit 118 and delay circuit 710 shown in FIG. 7, or by the combination of the logic circuit 118 and the delay circuit 810 shown in FIG. 7.

At 1220, the word line clock signal is received at the memory array, where the word line clock signal enables and disables memory read and write operations of the memory cell. Read and write operations of the memory cell may, for example, be enabled or disabled by the word line clock signal using the switching circuitry 130, 132 shown in FIGS. 1, 4, 6 and 7. At 1230, the local word line sleep signal is generated in response to the delayed clock signal and one or more power management control signals. The local word line sleep signal may, for example, be generate by the latch circuit 122 shown in FIG. 1 or the latch circuit 510 shown in FIGS. 4, 6 and 7.

At 1240, power to the word line driver is controlled using the local word line sleep signal. The local word line sleep signal is synchronized with the delayed clock signal such that the local word line sleep signal is prevented from turning off power to the word line driver until memory read and write operations of the memory cell are disabled by the word line clock signal. The local word line sleep signal and the delayed clock signal by, for example, be synchronized using the decoder 114, logic circuit 118 and latch circuit 122 shown in FIG. 1, the decoder 114, logic circuit 118 and latch circuit 510 shown in FIG. 4, the decoder 114, logic circuit 118, delay circuit 710 and latch circuit 510 shown in FIG. 6, or the decoder 114, logic circuit 118, delay circuit 810 and latch circuit 510 shown in FIG. 7.

In one example, a memory system may include a memory array with a memory cell and a word line driver, the memory array receiving a word line clock signal that enables and disables memory read and write operations of the memory cell. The memory array may further including a switching circuit coupled between the word line driver and a power source, the switching circuit being controlled by a local word line sleep signal to turn power to the word line driver on and off. A latch circuit may generate the local word line sleep signal in response to a delayed clock signal and one or more power management control signals. The word line clock signal and the delayed clock signal may both being generated as a function of a memory clock signal. The latch circuit may synchronize the local word line sleep signal with the delayed clock signal such that the local word line sleep signal is prevented from turning off power to the word line driver until memory read and write operations of the memory cell are disabled by the word line clock signal.

In another example, a method for controlling a sleep operation for a memory array that includes a memory cell and a word line driver may include the steps of: generating a word line clock signal and a delayed clock signal as a function of a memory clock signal; receiving the word line clock signal at the memory array, wherein the word line clock signal enables and disables memory read and write operations of the memory cell; generating, at a latch circuit, the local word line sleep signal in response to a delayed clock signal and one or more power management control signals; controlling power to the word line driver using the local word line sleep signal; and synchronizing the local word line sleep signal with the delayed clock signal such that the local word line sleep signal is prevented from turning off power to the word line driver until memory read and write operations of the memory cell are disabled by the word line clock signal.

In another example, a memory system may include a memory array with a first memory cell having a first pair of word line drivers and a second memory cell having a second pair of word line drivers, the memory array receiving a word line clock signal that enables and disables memory read and write operations of the first and second memory cells. The memory array may further include a first switching circuit coupled between the first pair of word line drivers and a power source, the first switching circuit being controlled by a first local word line sleep signal to turn power to the first pair of word line drivers on and off, and a second switching circuit coupled between the second pair of word line drivers and the power source, the second switching circuit being controlled by a second local word line sleep signal to turn power to the second pair of word line drivers on and off. A latch circuit may be included that generates the first and second local word line sleep signals in response to a delayed clock signal and one or more power management control signals. The word line clock signal and the delayed clock signal may both being generated as a function of a memory clock signal. The latch circuit may synchronize the first and second local word line sleep signals with the delayed clock signal such that the first and second local word line sleep signals are prevented from turning off power to the first and second pairs of word line drivers until memory read and write operations of the first and second memory cells are disabled by the word line clock signal.

The technology described and illustrated in the present disclosure may provide one or more advantages. For example, in embodiments, all memory operations (e.g., mission, DFT, and pipeline) may be performed without a timing impact due to power management assertion in the same cycle. As another example, in embodiments, the inclusion of the latch circuitry may introduce a minimum area impact (e.g., ~1%) on the overall design footprint. As yet another example, in embodiments, the memory system may not require race margins to be verified due to PM assertion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory system, comprising:
a memory array including a memory cell and a word line driver, the memory array receiving a word line clock signal that enables and disables memory read and write operations of the memory cell;
the memory array further including a switching circuit coupled between the word line driver and a power source, the switching circuit being controlled by a local word line sleep signal to turn power to the word line driver on and off; and
a latch circuit that generates the local word line sleep signal in response to a delayed clock signal and one or more power management control signals,
the word line clock signal and the delayed clock signal both being generated as a function of a memory clock signal,
wherein the latch circuit synchronizes the local word line sleep signal with the delayed clock signal such that the local word line sleep signal is prevented from turning off power to the word line driver until memory read and write operations of the memory cell are disabled by the word line clock signal.

2. The memory system of claim 1, further comprising:
a clock generator that generates a local clock signal as a function of the memory clock signal, and wherein the word line clock signal and the delayed clock signal are generated as a function of the local clock signal.

3. The memory system of claim 2, further comprising:
a decoder that generates the word line clock signal in response to the local clock signal and pre-decoded address lines.

4. The memory system of claim 3, further comprising:
a delay circuit that delays the local clock signal to generate the delayed clock signal, wherein the delay circuit includes an even number of buffers, the number of buffers being selected to synchronize the delayed clock signal and the word line clock signal.

5. The memory system of claim 1, further comprising:
a logic circuit configured to generate a word line sleep signal in response to the one or more power management control signals, and
wherein the latch circuit generates the local word line sleep signal in response to the delayed clock signal and the word line sleep signal.

6. The memory system of claim 3, further comprising:
a delay tracking element that delays the local clock signal to generate the delayed clock signal, wherein the delay tracking element is configured to synchronize the delayed clock signal and the word line clock signal.

7. The memory system of claim 6, wherein the delay tracking element comprises a length of conductive trace material.

8. A method for controlling a sleep operation for a memory array that includes a memory cell and a word line driver, comprising:

generating a word line clock signal and a delayed clock signal as a function of a memory clock signal;
receiving the word line clock signal at the memory array, wherein the word line clock signal enables and disables memory read and write operations of the memory cell;
generating, at a latch circuit, a local word line sleep signal in response to the delayed clock signal and one or more power management control signals;
controlling power to the word line driver using the local word line sleep signal; and
synchronizing the local word line sleep signal with the delayed clock signal such that the local word line sleep signal is prevented from turning off power to the word line driver until memory read and write operations of the memory cell are disabled by the word line clock signal.

9. The method of claim 8, further comprising:
generating a local clock signal as a function of the memory clock signal, wherein the word line clock signal and the delayed clock signal are generated as a function of the local clock signal.

10. The method of claim 9, further comprising:
generating, at a decoder, the word line clock signal as a function of the local clock signal and pre-decoded address lines.

11. The method of claim 10, further comprising:
delaying the local clock signal to generate the delayed clock signal synchronous with the word line clock signal.

12. The method of claim 8, further comprising:
generating a word line sleep signal in response to the one or more power management control signals, and
wherein the local word line sleep signal is generated in response to the delayed clock signal and the word line sleep signal.

13. A memory system, comprising:
a memory array that includes a first memory cell having a first pair of word line drivers and a second memory cell having a second pair of word line drivers, the memory array receiving a word line clock signal that enables and disables memory read and write operations of the first and second memory cells;
the memory array further including,
a first switching circuit coupled between the first pair of word line drivers and a power source, the first switching circuit being controlled by a first local word line sleep signal to turn power to the first pair of word line drivers on and off, and
a second switching circuit coupled between the second pair of word line drivers and the power source, the second switching circuit being controlled by a second local word line sleep signal to turn power to the second pair of word line drivers on and off;
a latch circuit that generates the first and second local word line sleep signals in response to a delayed clock signal and one or more power management control signals,
the word line clock signal and the delayed clock signal both being generated as a function of a memory clock signal,
wherein the latch circuit synchronizes the first and second local word line sleep signals with the delayed clock signal such that the first and second local word line sleep signals are prevented from turning off power to the first and second pairs of word line drivers until memory read and write operations of the first and second memory cells are disabled by the word line clock signal.

14. The memory system of claim 13, further comprising:
a clock generator that generates a local clock signal as a function of the memory clock signal, and wherein the word line clock signal and the delayed clock signal are generated as a function of the local clock signal.

15. The memory system of claim 14, further comprising one or more latch circuits configured to synchronize the one or more power management control signals with the local clock signal.

16. The memory system of claim 15, further comprising:
a decoder that generates the word line clock signal in response to the local clock signal and pre-decoded address lines.

17. The memory system of claim 16, further comprising:
a delay circuit that delays the local clock signal to generate the delayed clock signal, wherein the delay circuit includes an even number of buffers, the number of buffers being selected to synchronize the delayed clock signal and the word line clock signal.

18. The memory system of claim 13, further comprising:
a logic circuit configured to generate a word line sleep signal in response to the one or more power management control signals, and
wherein the latch circuit generates the first and second local word line sleep signals in response to the delayed clock signal and the word line sleep signal.

19. The memory system of claim 16, further comprising:
a delay tracking element that delays the local clock signal to generate the delayed clock signal, wherein the delay tracking element is configured to synchronize the delayed clock signal and the word line clock signal.

20. The memory system of claim 19, wherein the delay tracking element comprises a length of conductive trace material.

* * * * *